(12) United States Patent
Brouns (10) Patent No.: US 7,227,145 B2
(45) Date of Patent: Jun. 5, 2007

(54) POLARIZATION AND WAVELENGTH-SELECTIVE PATCH-COUPLED INFRARED PHOTODETECTOR

(75) Inventor: Austin J. Brouns, Dallas, TX (US)

(73) Assignee: Lockheed Martin Corporation, Bethesda, MD (US)

( * ) Notice: Subject to any disclaimer, the term of this patent is extended or adjusted under 35 U.S.C. 154(b) by 432 days.

(21) Appl. No.: 10/883,095

(22) Filed: Jul. 1, 2004

(65) Prior Publication Data

US 2006/0000974 A1 Jan. 5, 2006

(51) Int. Cl.
*G01J 5/00* (2006.01)

(52) U.S. Cl. .................................. 250/338.1
(58) Field of Classification Search .............. 250/338.1
See application file for complete search history.

(56) References Cited

U.S. PATENT DOCUMENTS

| | | | | |
|---|---|---|---|---|
| 5,047,822 | A * | 9/1991 | Little et al. | 359/321 |
| 5,519,529 | A * | 5/1996 | Ahearn et al. | 359/248 |
| 5,773,831 | A | 6/1998 | Brouns | |
| 6,054,718 | A * | 4/2000 | Dodd et al. | 257/10 |
| 6,452,187 | B1 * | 9/2002 | Claiborne et al. | 250/370.12 |
| 6,788,461 | B2 * | 9/2004 | Kurtz et al. | 359/486 |
| 2003/0146374 | A1* | 8/2003 | Bois et al. | 250/225 |
| 2005/0006584 | A1* | 1/2005 | Kawakubo et al. | 250/338.2 |

OTHER PUBLICATIONS

Tech Search online brochure, http://www.mdatechnology.net/techsearch.asp?articleid=420, dated Dec. 1, 2003 (4 pages).
"Antenna-Coupled Infrared Detectors", Cornell NanoScale Facility, CNF Project Sheet # 659-97 (pp. 200-201, undated).

* cited by examiner

*Primary Examiner*—David Porta
*Assistant Examiner*—Christine Sung
(74) *Attorney, Agent, or Firm*—Daren C. Davis; James E. Walton (57) ABSTRACT

A photodetector for detecting the polarization or wavelength of incident infrared radiation (IR) is described. The polarization sensitive photodetector operates using two sets of patches and corresponding cavities, the first set resonating with IR having a first polarization, while the second set resonates with IR having an orthogonal, second polarization. The polarization sensitive photodetector thus outputs two signals, proportional to the first and second polarizations, respectively. The wavelength sensitive photodetector operates using two sets of patches and corresponding cavities, the first set resonating at a first IR wavelength, while the second set resonates at a different IR wavelength. The wavelength sensitive photodetector thus outputs two signals, proportional to the first and second wavelengths, respectively. The patches have a length corresponding to odd multiples of the effective wavelength of the IR, while the thickness of the photodetector is typically one fourth of the effective wavelength.

55 Claims, 8 Drawing Sheets

Prior Art

FIG. 1A

Prior Art

FIG. 1B

Prior Art

FIG. 2A

Prior Art

POLARIZATION AND WAVELENGTH-SELECTIVE PATCH-COUPLED INFRARED PHOTODETECTOR

FIELD OF THE INVENTION

The present invention relates to an apparatus for detecting radiation. In particular, the present invention provides for determining the polarization and/or wavelength of incident infrared radiation, thereby improving infrared imaging.

BACKGROUND OF THE INVENTION

Detectors for infrared (IR) radiation have many applications. Infrared radiation can often be used to detect objects where visible light is either blocked or not present. Thus, it is possible to use IR detection at night or through clouds, dust, or haze. An IR detector can be in the form of either a single detecting element or an array of such elements to produce an image. A detector that produces such an image is termed a focal plane array.

Infrared radiation can be detected through various ways. One such way is by the use of a material that generates electric charge carriers in response to incident IR radiation. Examples of such photosensitive material are mercury cadmium telluride and a multi-layered structure termed a multiple quantum well (MQW) structure that has alternating layers of wells and barriers.

Depending upon the application, it may be necessary to detect a man-made object in a background of natural objects. It has been found that many natural objects emit IR radiation that has approximately equal magnitudes in both orthogonal polarizations. However, it has been found that most man-made objects tend to emit IR radiation that is significantly biased in favor of one polarization or the other. For this reason, polarization sensitive IR radiation detectors provide one method of distinguishing natural objects from man-made objects.

In still further applications, it may be necessary to accurately determine the temperature of an object. An apparatus that detects the temperature of an object based on measurements at a single radiation wavelength are inaccurate if the emissivity of the object is unknown. A more accurate method for determining the temperature is to take measurements of the object at two different radiation wavelengths. This provides a method of determining the temperature of an object that is less sensitive to the emissivity of the object.

BRIEF SUMMARY OF THE INVENTION

A first object of the invention is to provide an IR photodetector that is sensitive to the polarization of received IR radiation. By subtracting a signal generated by sensing a first IR polarization from a signal generated by sensing a second, orthogonal IR polarization, the polarization of the received IR radiation can be determined. If the resultant difference is very small, it is more likely the source of the radiation is a natural object. If the resultant difference is large, it is more likely that the source of the radiation is man-made.

A device that satisfies this first object includes an IR absorbing layer for absorbing IR radiation. One or more first patches for coupling IR radiation of a first polarization are located on a first surface of a first contact. Each of the first patches extends in first and second orthogonal directions. The length of the first patches in the first direction is greater than the length of the first patches in the second, orthogonal direction. The IR absorbing layer is located on a second surface of the first contacts, opposite the one or more first patches. One or more second patches for coupling IR radiation of a second polarization are located on the first surface of a second contact. As with the first patches, each of the second patches extends in first and second orthogonal directions. The length of the second patches in the first direction is less than the length of the second patches in the second direction. The IR absorbing layer is located on a second surface of the second contacts, opposite the one or more second patches. The device includes a contact layer located on the side of the IR absorbing layer opposite the first and second contacts. Lastly, the device also includes a groundplane, which is located on a surface of the contact layer opposite the IR absorbing layer. The detector operates by generating a first signal between the first contacts and the contact layer when IR radiation of the first polarization is absorbed. The detector generates a second signal between the second contacts and the contact layer when IR radiation of the second polarization is absorbed.

A second object of the invention is to provide an infrared photodetector that is sensitive to at least two different wavelengths of IR radiation. Through appropriate signal processing of the signals due to each of the at least two different IR radiation wavelengths, the temperature of the radiation source can be determined.

A device that satisfies this second object includes first and second IR absorbing layers for absorbing corresponding first and second wavelength bands of IR radiation. One or more first patches for coupling IR radiation of the first wavelength band are located on a first surface of a first contact, each of the first patches having a first area. The first IR absorbing layer is located on a second surface of the first contacts, opposite the one or more first patches. One or more second patches for coupling IR radiation of the second wavelength band are also located on the first surface of the first contact. Each of the second patches has a second area, the first area being greater than the second area. A second contact is located on a side of the first IR absorbing layer opposite the first contact. The second IR absorbing layer is located on a side of the second contact opposite the first IR absorbing layer. A contact layer is located on a side of the second IR absorbing layer opposite the second contact. Lastly, the device also includes a groundplane, which is located on a surface of the contact layer opposite the second IR absorbing layer. The detector operates by generating a first signal between the first contact and the second contact when IR radiation of the first wavelength band is absorbed by the first IR absorbing layer. The detector generates a second signal between the second contact and the contact layer when IR radiation of the second wavelength band is absorbed by the second IR absorbing layer.

While the above objects and devices are for single devices, an array of such devices for creating images, i.e., a focal plane array, is also envisioned. Methods corresponding to each of the above objects are also envisioned.

BRIEF DESCRIPTION OF THE DRAWINGS

The present invention is described in reference to the following Detailed Description and the drawings in which.

DETAILED DESCRIPTION OF THE INVENTION

The following description begins with a review of a prior art patch coupled IR photodetector as disclosed in U.S. Pat. No. 5,773,831, which issued to Austin Brouns, and is hereby incorporated by reference. A description of the present invention and its various embodiments follows this review of the prior art. Elements that are common through the several Figures are identified with common numbers.

Prior Art

Figure 1A:
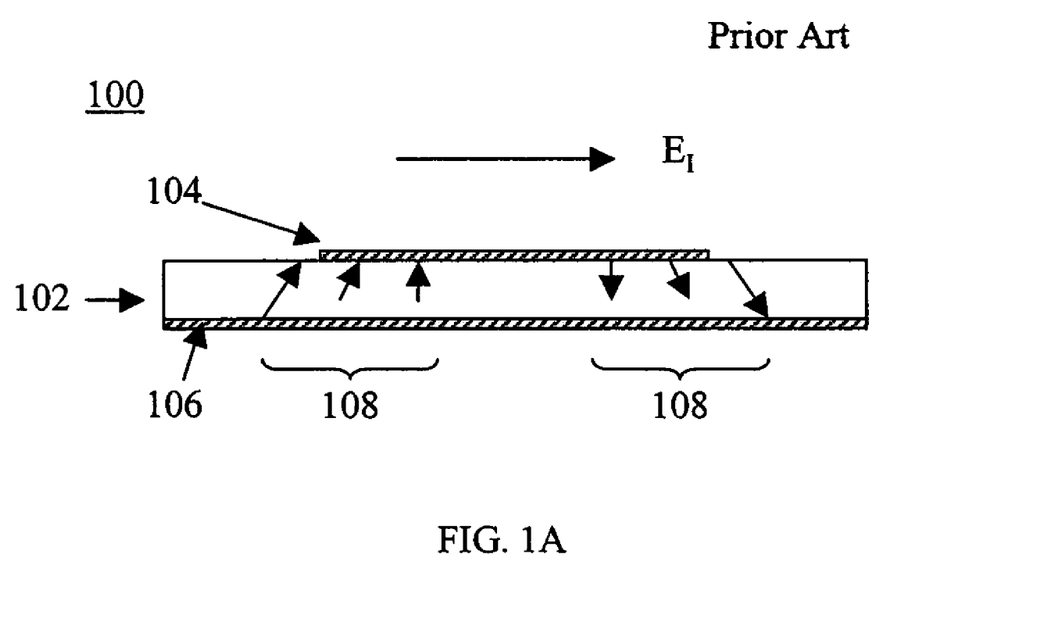
FIGS. 1A–1B illustrate the direction and magnitude of the electric field within a device according to the present invention.

FIG. 1A is a cross-sectional view of a prior art patch coupled IR photodetector 100. The patch coupled IR photodetector 100 includes an IR absorbing layer 102, a patch 104 located on a first surface of the IR absorbing layer 102, and a groundplane 106, located on a second, opposing surface of the IR absorbing layer 102.

The IR absorbing layer 102 may be formed of any one of several semiconductor materials. Selection of the particular semiconductor material is determined by what wavelength of IR radiation is to be absorbed. For devices operating in the middle wavelength IR (MWIR), corresponding to 3–5 μm, in the long wavelength IR (LWIR), corresponding to 8–12 μm, or in the very long wavelength IR (VLWIR), corresponding to 12–20 μm, several different material designs are possible. Each of the different material designs employs multiple quantum wells, but the barriers and wells have different compositions and thicknesses. For operating in the LWIR or VLWIR, AlGaAs barriers and GaAs wells are typically used, while operating in the MWIR typically requires use of AlGaAs barriers and InGaAs wells. Other MQW material designs can employ InGaAsP barriers and InAs wells. A typical barrier thickness is 300–500 Å, while a typical well thickness is 25–50 Å. Multiple quantum well materials are also preferred due to their low cost and ease of fabrication. It is important that the IR absorbing layer 102 be relatively thin for efficient absorption. The preferred thickness of the IR absorbing layer 102 is approximately ¼ or less of the effective wavelength ($\lambda_{Eff}$) of the IR radiation to be absorbed, though a thickness of ⅓ of $\lambda_{Eff}$ will operate with reduced efficiency. The effective wavelength is the wavelength of the IR radiation within the IR absorbing layer 102, and is found by dividing the wavelength of the IR radiation in free space by the index of refraction for the IR absorbing layer 102.

The patch 104 must be electrically conductive in the IR. The preferred materials for the patch 104 are metals, with gold and various alloys thereof being most preferred. The minimum thickness of the patch 104 is approximately 600 Å, which is two to three times the skin depth of the IR radiation in the patch 104. When the thickness of the patch 104 is less than this, ohmic losses increase, thereby reducing overall photodetector efficiency. While the patch 104 is illustrated as a square, circular patches having the same area are approximately equally effective. The groundplane 106 is preferably made of metal, with gold and various alloys thereof being most preferred. A typically thickness of the groundplane 106 is 2000 Å.

Figure 1B:
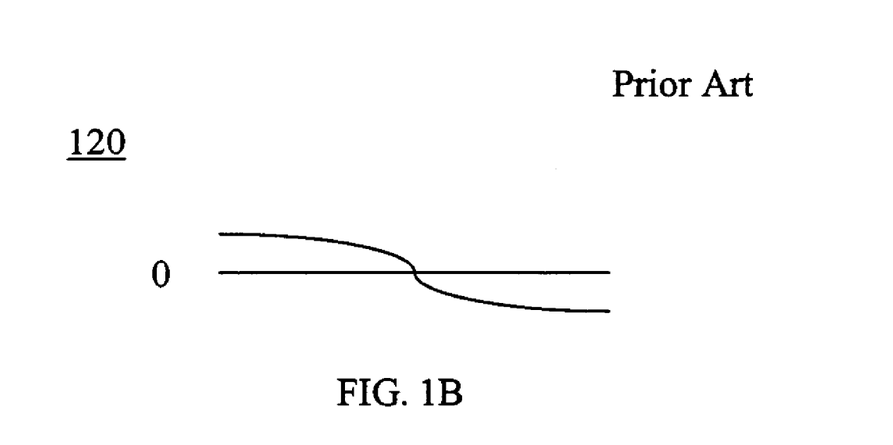

The electric field of the incident IR radiation $E_1$ is parallel to the surface of patch 104. The wave is diffracted by the two opposing edges of the patch 104 that are perpendicular to the incident electric field vector. This causes a portion of the wave to change direction by 90 degrees and to be launched simultaneously, from opposing edges of the patch 104, into a pair of counter-propagating waves in the IR absorbing layer 102 between the patch 104 and the groundplane 106. The electric field vector under the patch 104 is normal to the patch 104 and groundplane 106 surfaces, its magnitude being illustrated in FIG. 1B. The preceding description will be well known to those familiar with microstrip waveguide and microstrip patch antennas. The counter-propagating waves are repeatedly reflected at the boundaries of the patch 104. For a specific set of IR wavelengths, the counter-propagating waves are found to constructively interfere, causing a resonance condition whereby the electric field strength is greatly increased in the IR absorbing layer 102. This is highly favorable for the efficient conversion of IR energy to photocurrent. For resonance of the IR radiation to occur in the cavity under the patch 104, a length of the patch 104 must correspond to an odd multiple of half of $\lambda_{Eff}$. Thus, the length of the patch 104 in the resonating direction must be $\lambda_{Eff}/2$, $3\lambda_{Eff}/2$, $5\lambda_{Eff}/2$, etc. The single null in the magnitude of the induced electric fields illustrated in FIG. 1B illustrates the case where the length of the patch 104 in the resonating direction is $\lambda_{Eff}/2$. Device simulation shows that a patch length of $3\lambda_{Eff}/2$ is preferred as this length is more tolerant of slight fabrication variations. While a longer patch length of $5\lambda_{Eff}/2$ is even more tolerant of fabrication variations, such a long patch may support more than a single resonant wavelength. Multiple resonant wavelengths are undesirable as this leads to spectral crosstalk.

The use of antenna coupling is a well-known means of intercepting and concentrating IR radiation. For example, U.S. Pat. No. 5,248,884, entitled "Infrared Detector," employs an antenna-like structure without a groundplane to create fringing fields in sensitive detector material. In this type of detector, the electric fields are curved, relatively unbounded, and without a single predominant polarization relative to the detector plane. This would also be true if the detector included a groundplane located $\lambda_{Eff}/4$ behind the antenna. Such a detector could employ many different types of antenna configurations including dipoles, bow ties, and spirals. In contrast, a patch coupled IR photodetector 100 has a patch-groundplane spacing of $\lambda_{Eff}/3$ or less. This spacing forces the incident IR radiation energy into a well defined resonant mode in which the electric field is predominantly perpendicular to the patch 104 and groundplane 106. The net result is that the incident IR radiation is coupled to the IR absorbing layer 102 in a quasi-TEM electromagnetic mode that travels parallel to the groundplane 106. This relatively thin resonant cavity between the patch 104 and the groundplane 106 helps to distinguish a patch coupled IR photodetector from the prior art.

The patch's ability to change the direction of the polarization of the electric field is especially important when MQW material is used for the IR absorbing layer 102. Multiple quantum well material will absorb only a very small portion of the incident IR radiation if the electric field of the radiation is parallel to the plane of the multiple quantum wells. Those of skill in the art will appreciate that optical gratings are typically used for coupling the incident IR radiation for absorption in MQW material. The patch 104 provides an efficient alternative means for changing the direction of the polarization of the incident IR radiation, and may be easier to fabricate. By changing the direction of the polarization of the incident IR radiation, a substantial portion of the induced electric fields will be perpendicular to the plane of the multiple quantum wells. Multiple quantum well material much more readily absorbs radiation which has its electric field perpendicular to the plane of the multiple quantum wells.

As discussed above, the thickness of the IR absorbing layer 102 is preferably not more than approximately ¼ of $\lambda_{Eff}$. When the thickness of the IR absorbing layer 102 approaches ½ of $\lambda_{Eff}$, the strongly absorbed mode of the induced electric fields decreases as a second mode of induced electric fields are formed. While a thinner IR absorbing layer 102 is possible, the volume of absorbing IR material decreases, and thus quantum efficiency and sensitivity of the patch coupled IR photodetector 100 suffers. This is especially true as the patch 104 and groundplane 106 are not perfect conductors and will create some loss of signal.

Figure 2A:
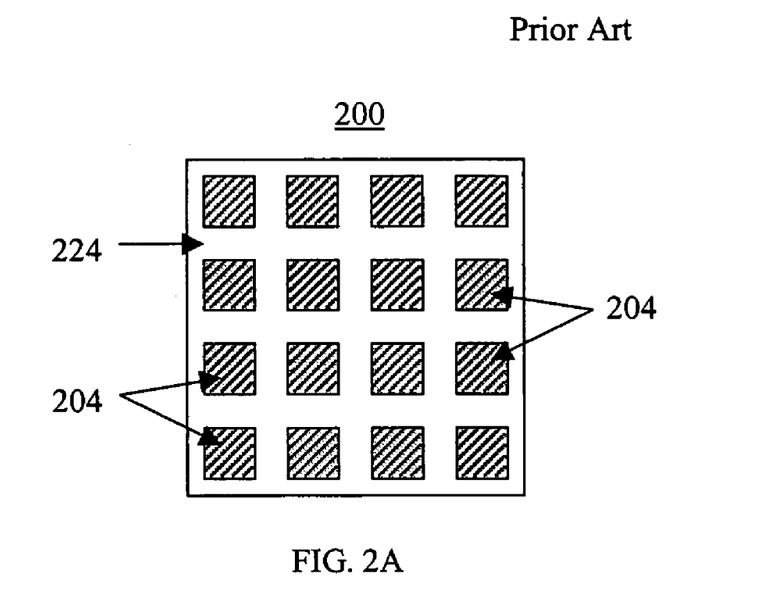
FIGS. 2A–2B are plan and cross-sectional illustrations of a prior art device.
Figure 2B:
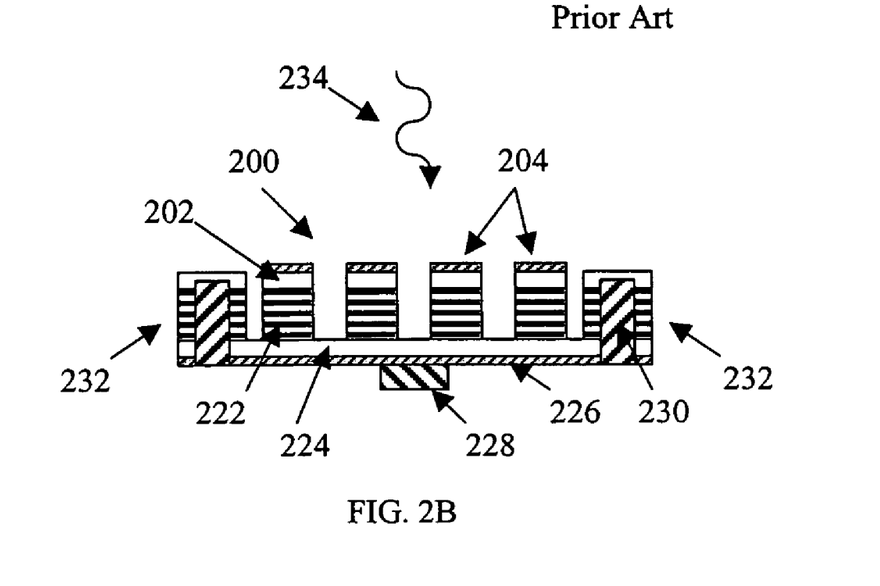

FIG. 2A is a plan view of a photodetector 200 using MQW material for the IR absorbing layer. The photodetector 200 is one of an array of photodetectors forming a focal plane array, such as can be used for imaging. The photodetector 200 includes an array of patches 204, with an underlying bottom contact layer 224 showing in the space between the patches 204. FIG. 2B is a cross-sectional view of the photodetector 200. When MQW material is used for the IR absorbing layer, a three-layer structure is required. The three-layer structure includes a top contact 202, the MQW IR absorbing layer 222, and the bottom contact layer 224. The top and bottom contacts 202, 224 are electrically conductive layers, preferably made of highly doped n+ GaAs Adjacent the bottom contact layer 224 is a groundplane 226. A deformable contact 228 is placed upon the side of the groundplane 226 opposite of the bottom contact layer 224. Each photodetector is isolated from the adjacent photodetectors 232 by a trench that is filled with an insulator 230. IR radiation 234 is incident upon the photodetector 200 on the side with the patches 204. As described above, the patches 204 have a minimum thickness of approximately 600 Å, with 1000 Å or more being preferred. To improve adhesion of the patches 204, a layer of titanium is preferably deposited first. The groundplane 226 is preferably made of metal, with gold and various alloys thereof being most preferred. An alloy of gold and germanium provides a low resistance ohmic contact to the bottom contact layer 224. A typically thickness of the groundplane 226 is 2000 Å.

As can be seen in FIG. 2B, each of the individual patches 204 is isolated by removing the material around the patch 204 down to the bottom contact layer 224. The reason for removing the material is to improve the signal-to-noise ratio of the photodetector 200. As before, the MQW IR absorbing layer 222 much more strongly absorbs IR radiation with an electric field perpendicular to the plane of the multiple quantum wells. Thus, in locations where the electric field is not perpendicular to the plane of the MQW IR absorbing layer 222, little to no signal is being generated. Referring to FIG. 1B, the electric fields are perpendicular under the patch and fringe at the edges of the patch such that less of the electric field is perpendicular to the plane of the MQW IR absorbing layer 222. Therefore, removal of material not beneath the patches 204 has relatively little effect on the magnitude of the signal current. However, noise current is generated throughout all of the MQW IR absorbing layer 222. Thus, by removing the portion of the MQW IR absorbing layer 222 that is not contributing any signal current, the noise current can be reduced. The net result is an improved signal-to-noise ratio.

As noted above, photodetector 200 is one of many photodetectors forming a focal plane array. The array of photodetectors would be mated to a multiplexer (not shown) to read out the signals from each of the photodetectors. The array of photodetectors is mated by means of the deformable contact 228 on each photodetector to a corresponding deformable contact on the multiplexer.

As previously noted, the overall thickness of the IR absorbing layer is preferably approximately ¼ $\lambda_{Eff}$ or less. When the IR absorbing layer is formed of MQW material, the thickness of the top contact 202 and bottom contact layer 224 must be included in this overall thickness. The resulting overall structural dimensions and materials of a preferred embodiment is thus as follows: The top contact 202 is formed of n+ GaAs having a thickness of 0.15–0.25 µm, the top contact 202 being transparent to the IR radiation 234. The bottom contact layer 224 is similarly formed of n+ GaAs having a thickness of 0.15–0.25 µm. The remainder of the thickness is the MQW IR absorbing layer 222. For a photodetector 200 sensitive to IR radiation having a wavelength in free space of 10 µm, the MQW IR absorbing layer 222, the top contact 202, and the bottom contact layer 224 have an index of refraction of approximately 3.2. Thus, $\lambda_{Eff}$ is approximately 3.1 µm, and the thickness of a ¼ $\lambda_{Eff}$ thick photodetector 200 is approximately 0.8 µm. As the top contact 202 and the bottom contact layer 224 total a thickness of 0.4 µm, this leaves 0.4 µm for the MQW IR absorbing layer 222. An example MQW IR absorbing layer includes 450 Å thick AlGaAs barriers between which are placed 35–50 Å thick n-type GaAs wells. Therefore, the MQW IR absorbing layer 222 in the present example would preferably include eight AlGaAs barriers and seven GaAs wells. Due to $\lambda_{Eff}$ being 3.1 µm, the length of the patches 204 should be approximately 1.55 µm, 4.65 µm, 7.75 µm, etc., but preferably 4.65 µm. The example layer thicknesses and compositions are illustrative only. Depending upon the application for the photodetector 200, alternative thicknesses and compositions can be used. As an example, if the photodetector 200 is going to be operated at very low temperatures, noise currents due to tunneling of electrons through the AlGaAs barriers may be significantly reduced. Under these conditions, thinner AlGaAs barriers can be used, thereby permitting the use of more than seven GaAs wells to improve absorption, while still retaining approximately the same overall thickness.

As noted above, each photodetector 200 in the focal plane array is isolated from the adjacent photodetectors by an isolating trench filled with an insulator 230. The isolating trench is preferably formed by etching away the bottom contact layer 224, the MQW IR absorbing layer 222, and a portion of the top contact 202. The isolating trench is then preferably filled with a nonconductive epoxy, thereby electrically isolating the individual photodetectors 200, but providing mechanical strength to the focal plane array. The deformable contact 228 is formed of In, as is well known in the art.

The photodetector 200 operates as follows: IR radiation 234 is incident upon the photodetector 200. The IR radiation resonates in the patches 204 due to the length of the patches 204, thereby launching counter-propagating quasi-TEM waves in the MQW IR absorbing layer 222. A large portion of the counter-propagating quasi-TEM waves is perpendicular to the plane of the MQW IR absorbing layer 222 and is thus absorbed therein. The absorption process creates excited electrons in the GaAs wells, which are swept out of the MQW IR absorbing layer 222 when a bias is placed across the top contact 202 and the bottom contact layer 224. The magnitude of the resulting signal current corresponds to the magnitude of the IR radiation 234 in the appropriate wavelength band incident upon the photodetector 200. Alternatively, the magnitude of a resulting change in resistance corresponds to the magnitude of the IR radiation 234 in the appropriate wavelength band incident upon the photodetector 200.

Figure 3A:
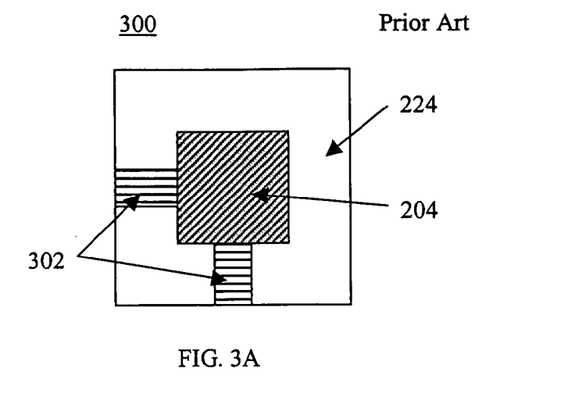
FIGS. 3A–3C illustrate the electrical interconnection of the patches of a prior art device.
Figure 3B:
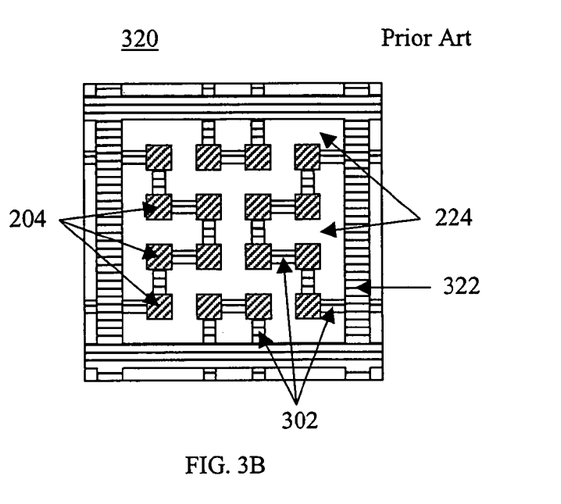
Figure 3C:
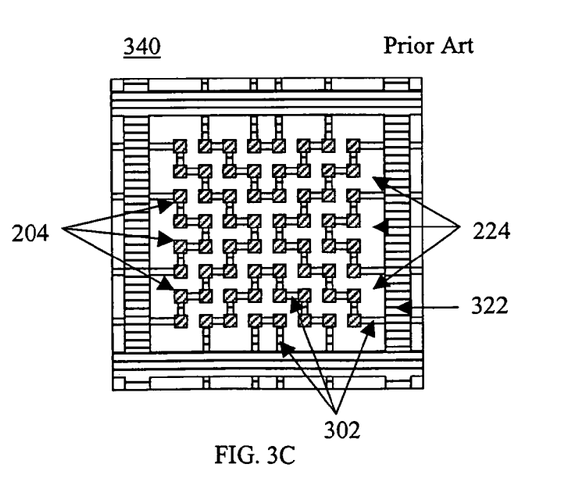

In the preceding example, the patches 204 had a minimum size of 1.55 µm. As making electrical contact to features this small is difficult, it is preferable to connect the top contact 202 of all the patches 204 in a photodetector 320 to a common signal bus 322 that surrounds each photodetector 320. FIGS. 3A–3C illustrate how the patches 204 can be interconnected. FIG. 3A illustrates a unit cell 300 of one patch 204, the underlying bottom contact layer 224, and interconnect 302. FIG. 3B illustrates the common signal bus 322 for the single photodetector 320 having a size of approximately 24 µm on a side, while FIG. 3C illustrates a photodetector 340 having a size of approximately 40 µm on a side.

The width of the interconnect 302 is preferably 1.0 µm or less to minimize interference with the resonance of the patches 204. The interconnect 302 is formed of the top contact 202 and the MQW IR absorbing layer 222. The final effect is one of larger islands, the patches 204, interconnected by ridges, the interconnect 302. The ridges of interconnect 302 and the common signal bus 322 are created by retaining a portion of the top contact 202 and the MQW IR absorbing layer 222 while etching away the remaining portion of the top contact 202 and MQW IR absorbing layer 222.

Figure 4:
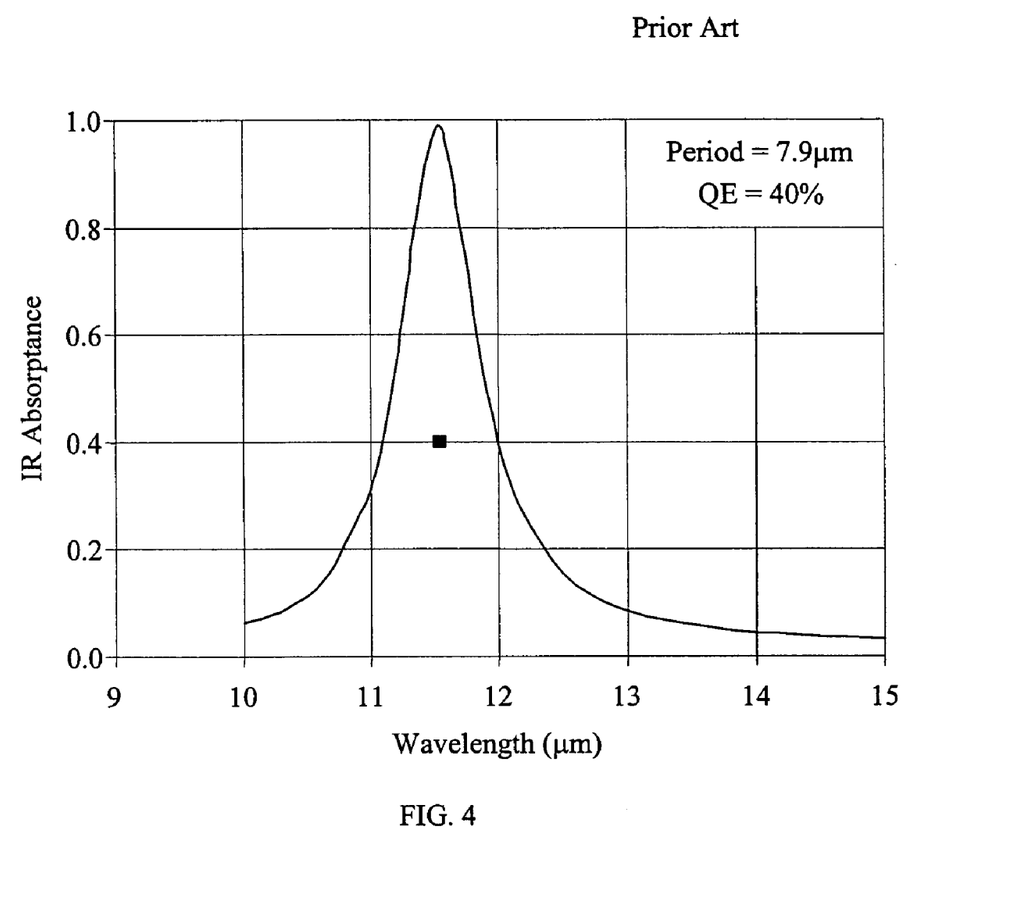
FIG. 4 illustrates the IR absorptance and quantum efficiency of a device according to the present invention.

A simulation of a unit cell similar to that shown in FIG. 3A produced the IR absorptance curve illustrated in FIG. 4. The unit cell simulated to produce FIG. 4 had a square patch that was 1.8 µm long on each side, while the overall dimension of the cell, i.e., its period, was 7.9 µm on each side. This design results in a patch that covers approximately 5% of the total area of the unit cell. FIG. 4 shows the IR absorptance of this design to be virtually 100%. The quantum efficiency (QE) is noticeably less than this at 40%. The difference between the absorptance and quantum efficiency is mostly due to losses in the gold patch and ground plane, which are not perfect conductors.

The unit cell 300 illustrated in FIG. 3A is not to scale. Typically, the area of the patch 204 is 35% or less of the total area of the unit cell 300. As the percentage area of the patch increases, the dark current and noise increase, thereby decreasing sensitivity. It has been found that the area of the patch 204 can be as small as 5% of the total area of the unit cell 300 while maintaining high coupling efficiency. When the patch area is less than 5% of the unit cell area, the absorption cross-section is less than the area of the photodetector, i.e., not all IR radiation incident on the photodetector resonates with a patch. Thus, the prior art teaches that only 5% of the unit cell area is required for efficient coupling and that total patch area should be 35% or less to avoid loss of efficiency.

Present Invention

While the prior art patch coupled IR photodetectors are effective photodetectors, they are not sensitive to differences in the polarization of the incident IR radiation. Further, to provide sensitivity to more than a single narrow wavelength band, the prior art taught use of a structure having patches on different layers of materials. This multi-layered structure is difficult to fabricate and the quantum efficiency of the structure is low due to the distance between the patch and the groundplane necessitated by the multiple layers. A first embodiment of the present invention modifies the basic patch coupled IR photodetector in such a way as to provide polarization sensitivity. A second embodiment of the present invention modifies the basic patch coupled IR photodetector in such a way as to provide multiple wavelength sensitivity in a simpler structure leading to improved sensitivity. These modifications result in different performance characteristics compared with the basic patch coupled IR photodetector allowing new applications for the resultant devices.

Figure 5A:
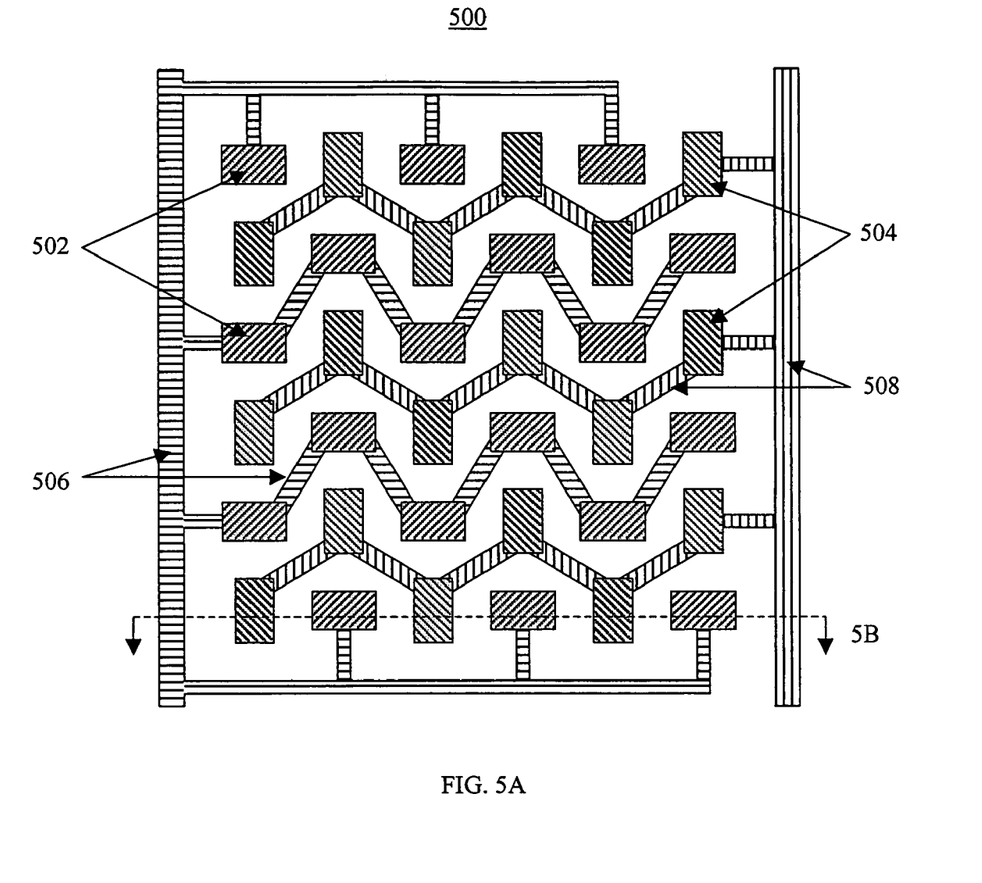
FIGS. 5A–5B illustrate a first embodiment of the present invention.

Due to the high coupling efficiency of patches occupying less than 25% of the unit cell, the present inventor discovered it is possible to use a portion of the remaining unit cell area for coupling radiation having a different wavelength or polarization. FIG. 5A illustrates a photodetector 500 according to a first embodiment of the present invention that employs two different patch designs in a single array for coupling radiation having different polarizations.

Figure 5B:
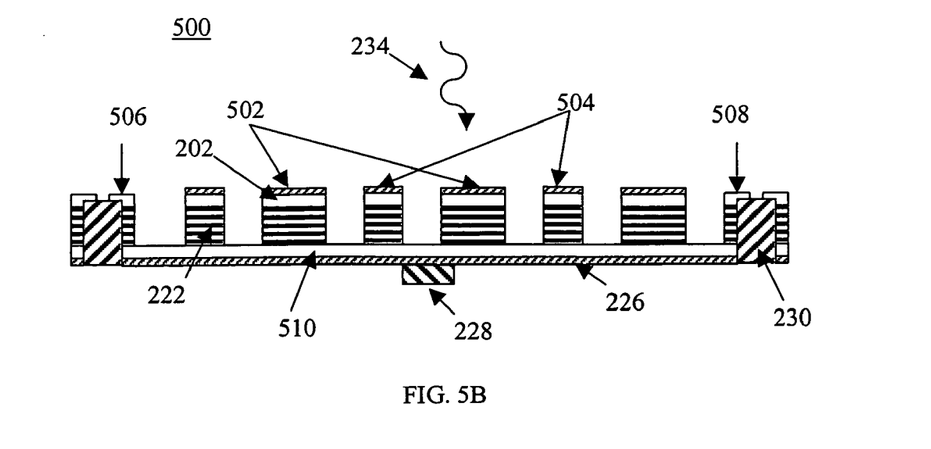

Photodetector 500 incorporates two sets of patches 502, 504. The first set of patches 502 form cavities that resonate with incident IR radiation in the horizontal direction as shown in FIG. 5A. For a design sensitive to IR radiation having a wavelength of 10 µm, the length of the first set of patches 502 in the horizontal direction is preferably 4.65 µm. The width of the first set of patches 502 in the vertical direction is less than 4.65 µm so that the first set of patches 502 will not resonate in the vertical direction at 10 µm. The first set of patches 502 could thus have a width, for example, of approximately 2.3 µm. Preferably, the first set of patches 502 are all interconnected by first interconnect 506, thus allowing a single, "horizontal polarization" signal to be created by the first set of patches 502. In like manner, the second set of patches 504 resonate in the vertical direction as shown in FIG. 5A, and thus have a length in the vertical direction of 4.65 µm. The second set of patches 504 could have a width in the horizontal direction of approximately 2.3 µm. As with the first set of patches 502, the second set of patches 504 are preferably interconnected by second interconnect 508, leading to a single "vertical polarization" signal created by the second set of patches 504. The first and second sets of patches 502, 504, including first and second interconnects 506, 508, occupy approximately 25–35% of the unit cell area. As fabrication line widths decrease, the width of the first and second interconnects 506, 508 can decrease leading to the first and second sets of patches 502, 504, and first and second interconnects 506, 508 occupying a smaller percent of the unit cell area. The underlying structure of the photodetector 500 can be similar to that of the prior art, and is illustrated in FIG. 5B. Sensing the respective polarization signals requires, in each photodetector 500, three electrical connections to a multiplexer, not illustrated. The first of these electrical connections is deformable contact 228 connected to a contact layer 510. The two additional electrical connections, not illustrated, are made to the first and second interconnects 506, 508.

While the first embodiment as described has the IR radiation resonating along the length of the first and second sets of patches 502, 504, this is not required. The first and second sets of patches 502, 504 may alternatively be designed such that the IR radiation resonates across the width of the patches. In either case, it is preferable that the resonance in the preferred direction be approximately ten times greater than in the non-preferred direction to ensure adequate discrimination between the two polarization signals. However, when the object emits highly polarized IR radiation and the background is very randomly polarized radiation, the factor of ten in resonance may be decreased without suffering undue loss of polarization discrimination.

The above example provided a length to width ratio of 4.65:2.3 for the first and second sets of patches 502, 504, however this is not required. The primary factors to consider when selecting the length to width ratio are ease and precision of fabrication, polarization discrimination, and the total area covered by the first and second sets of patches 502, 504. Ease and precision of fabrication is important, as the patch length must couple IR radiation having the correct wavelength for absorption by the IR absorbing layer. The length to width ratio should preferably provide the factor of ten greater resonance in the preferred direction relative to the non-preferred direction to ensure adequate polarization discrimination. Lastly, the length to width ratio should not lead to first and second sets of patches 502, 504 that cover more than 35% of the surface area of the photodetector. As one of skill in the art will appreciate, the length to width ratio should be different from 1:1, as this will not provide polarization discrimination.

When IR radiation having the appropriate wavelength is incident upon photodetector 500, it will resonate in either the first or second set of patches 502, 504 depending upon its polarization. Specifically, if the incident IR radiation is polarized such that its electric field is parallel to the first set of patches 502, a "horizontal polarization" signal would be generated between the first interconnect 506 and the contact layer 510. Alternatively, if the incident IR radiation is polarized such that its electric field is parallel to the second set of patches 504, a "vertical polarization" signal would be generated between the second interconnect 508 and the contact layer 510. Because natural objects tend to emit IR radiation that is approximately equal in magnitude in both orthogonal polarizations, horizontal and vertical polarizations signals of approximately equal magnitude will be generated.

Part of the reason natural objects tend to emit IR radiation of approximately equal magnitudes in both orthogonal polarizations is the uneven nature of natural surfaces. For instance, the leaves on trees in a forest will be at a wide range of angles relative to an IR radiation imaging system. This wide range of angles will cause the overall IR radiation emitted by the trees in the forest to have random polarization, thereby leading to a signal having approximately equal magnitude in both orthogonal polarizations. Similarly, a rocky or sandy surface will include a myriad of different surface orientations thereby providing an IR signal that is randomly polarized. In contrast, man-made objects tend to include extended flat surfaces. As an example, a vehicle typically has several large flat surfaces, such as the hood, roof, and trunk. IR radiation from the vehicle, especially that reflected by the vehicle, will tend to be strongly polarized in one direction. Thus, a detector that is sensitive to the polarization of the IR radiation would produce signals of greatly different magnitudes for IR radiation from a vehicle. As an example, a vehicle could be placed in a forest and the scene imaged with an IR radiation detector according to the first embodiment. By subtracting the first polarization image from the second orthogonal polarization image, the vehicle would be obvious because its polarization would lead to large differences between the two polarization images. In contrast, the difference between the two polarization images for forest portions of the image would be relatively small. Thus, the first embodiment of a polarization sensitive IR radiation detector provides an excellent means for discriminating man-made objects from natural objects.

The sensitivity of the first embodiment to differences in the polarization of the IR radiation is dependent upon the size and distance to the potential man-made object. If the man-made object is small and at a great distance, the IR radiation from the object may not provide a sufficient signal for discrimination. The IR radiation from such a small, distant object could fall entirely on a single pixel within an imaging IR radiation detector. Discrimination of a man-made object that is larger or nearer is feasible as the image of the object will fall upon several pixels within an imaging IR radiation detector. Under these conditions, subtracting the two different polarization images can provide a large enough difference that the man-made object can be detected. The number of pixels upon which the man-made object's image falls places a limit on use of the first embodiment for discriminating man-made objects from natural objects.

Natural backgrounds frequently have a polarization of 2% or less, and for this reason are considered unpolarized. In contrast, man-made objects may have a polarization significantly greater than 2%. For this reason, subtracting two different polarization images and using a threshold difference of approximately 2% will allow for discrimination of man-made objects from natural objects. One of skill in the art will appreciate that the 2% threshold is strongly dependent upon the expected background and the expected man-made object. The 2% threshold is thus a nominal guideline and can be adjusted as required.

Figure 6A:
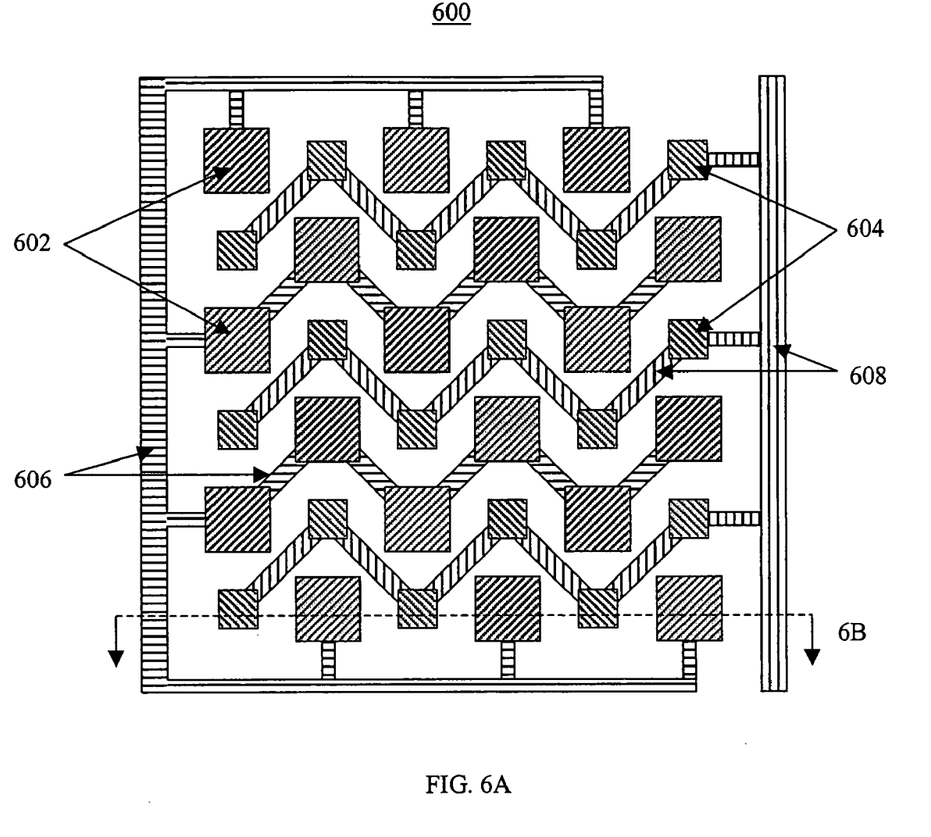
FIGS. 6A–6E are plan and cross-sectional illustrations of second through fifth embodiments of the present invention.

FIG. 6A illustrates a photodetector 600 according to a second embodiment of the present invention that employs two different patch designs for coupling radiation having two different wavelengths. That is, while the first embodiment focussed on discriminating polarization differences in objects at a single wavelength, the second embodiment discriminates relative temperature differences between objects using two or more wavelengths. Alternatively, the second embodiment could be used to determine the actual temperature of an imaged object. Photodetector 600 incorporates two sets of patches 602, 604. The first set of patches 602, having a larger area than the second set of patches 604, resonates at longer IR radiation wavelengths than does the second set of patches 604. The first set of patches 602 is interconnected by first interconnect 606, thus allowing a single, "longer wavelength" signal to be generated by the first set of patches 602. In like manner, the second set of patches 604 is interconnected by second interconnect 608, leading to a single "shorter wavelength" signal generated by the second set of patches 604.

Figure 6B:
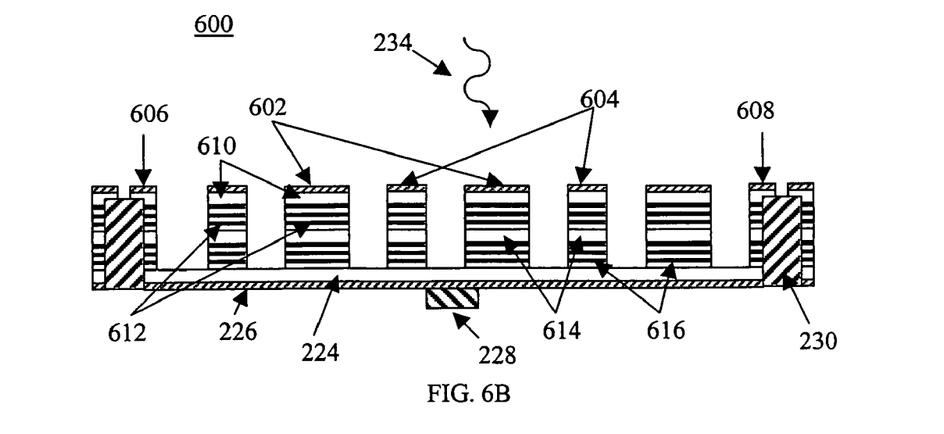

Unlike the first embodiment, the underlying structure of the photodetector 600 is different from that of the prior art illustrated in FIG. 2B. As illustrated in FIG. 6B, the photodetector 600, when using MQW IR absorbing material, employs a double stack of IR absorbing layers. The first and second sets of patches 602, 604 are located on a first contact 610. The first contact 610 makes electrical contact with a first IR absorbing layer 612. An intermediate contact 614 makes electrical contact with both the first IR absorbing layer 612 and a second IR absorbing layer 616. Contact layer 224 makes electrical contact with a side of the second IR absorbing layer opposite the intermediate contact 614. The photodetector 600 includes a groundplane 226, a deformable contact 228, and an insulator 230 like the prior art photodetector 200.

The double stack is a design that includes two different GaAs well widths or barriers having two different AlGaAs compositions. Such double stack designs are typically thicker than single stack designs if they are to have strong absorption. Because these double stack designs are likely to be thicker than ¼ $\lambda_{Eff}$, they may result in lower quantum efficiency photodetectors. It should be noted that the double stack design limitation may readily be overcome when operating in the VLWIR. If the free space wavelengths of the two bands of IR radiation are 16 µm and 20 µm, their effective wavelengths $\lambda_{Eff1}$ and $\lambda_{Eff2}$ are approximately 5.0 µm and 6.25 µm, respectively, within the first and second IR absorbing layers 612, 616. This results in an average effective wavelength $\lambda_{Eff}$ of 5.6 µm. In this case, the photodetector 600 could have the following dimensions: The first and intermediate contacts 610, 614 are 0.15 µm thick, while the contact layer 224 is also 0.15 µm thick. This leaves a total of 0.95 µm for the first and second IR absorbing layers 612, 616. With equal thickness for the first and second IR absorbing layers 612, 616, a nine barrier/eight well design is feasible. Such a design includes enough wells to provide sufficient absorption for a sensitive, two-color photodetector. A similar design operating at 10 µm would provide a thickness of 0.35 µm to be shared between the first and second IR absorbing layers 612, 616. Again splitting this thickness equally between the first and second IR absorbing layers 612, 616 yields a design with four barriers and 3 wells for each of the first and second IR absorbing layers 612, 616. During operation, the photodetector 600 generates a first signal between the first contact 610 and intermediate contact 614 when IR radiation is absorbed by the first IR absorbing layer 612. The photodetector 600 generates a second signal between the intermediate contact 614 and the contact layer 224 when IR radiation is absorbed by the second IR absorbing layer. Note that because two different wavelengths of IR radiation are being detected, the dimensions of the first and second patches 602, 604 are based upon odd multiples of $\lambda_{Eff1}/2$ and $\lambda_{Eff2}/2$. Because the first and second patches 602, 604 will couple only to their respective first and second IR absorbing layers 612, 616, the intermediate contacts 614 are not strictly required. In this case, the first signal is generated between the first interconnect 606 and the contact layer 224, while the second signal is generated between the second interconnect 608 and the contact layer 224.

Figure 6C:
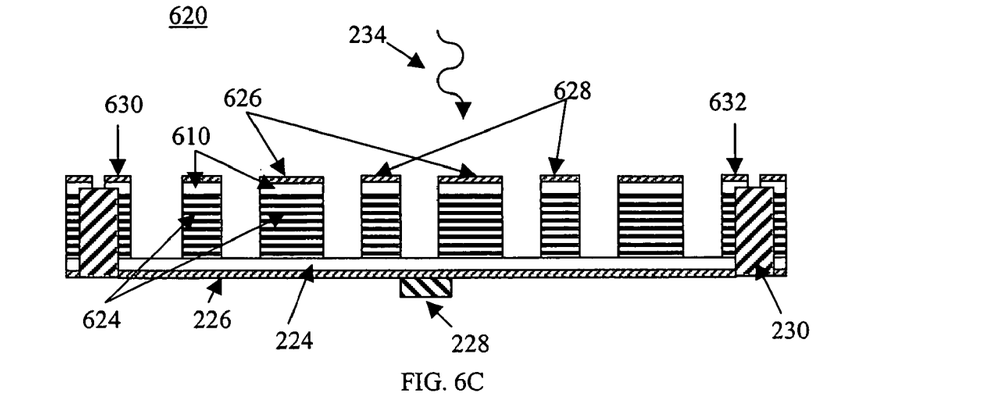

A third embodiment photodetector 620, illustrated in FIG. 6C, is an alternative to the above photodetector 600, which employs a different underlying structure. The third embodiment photodetector 620 employs only a single MQW IR absorbing layer 624, a top contact 610, and a contact layer 224. As with the previous embodiments, first and second sets of patches 626, 628 are connected by respective first and second interconnects 630, 632. The third embodiment photodetector 620 places some restrictions upon the areas of the first and second sets of patches 626, 628. Because the single IR absorbing layer 624 absorbs only a single wavelength band, the two resonating wavelengths cannot be widely separated. As will be appreciated by those of skill in the art, single IR absorbing layer 624 will only absorb IR radiation over a relatively narrow wavelength range, such as from 9.0–10.5 µm depending upon the design of the single IR absorbing layer 624. Use of this single IR absorbing layer 624 in the third embodiment photodetector 620 would permit creating two resonant wavelengths of 9.3 µm and 10.2 µm, for example. The difference in the sizes of the first and second patches 626, 628 of third embodiment photodetector 620 will be less than that of the first and second patches 602, 604 of photodetector 600 with its more widely spaced resonant wavelengths. While such a simplified design permits detection at two different wavelengths, it results in less accurate determinations of temperature than when two more widely separated resonant wavelengths are used.

Figure 6D:
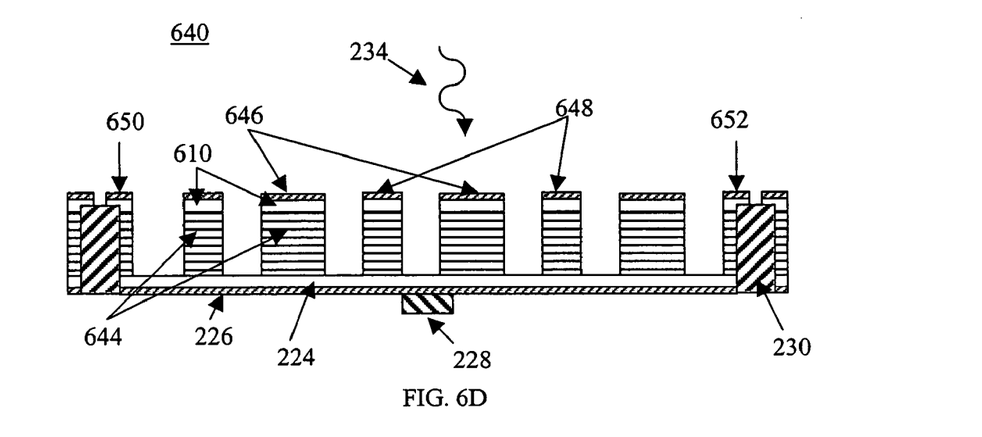

A fourth embodiment photodetector 640, illustrated in FIG. 6D, is similar to the third embodiment, but uses a broadband IR absorbing layer 644 instead of the more narrowband IR absorbing layer 624. The broadband IR absorbing layer 644 employs one of two different designs. The first broadband design includes a graded quantum well width, for example from 30 Å to 50 Å. A second broadband design includes material of the so-called bound-to-continuum design in which the absorption process occurs between a bound lower energy state and an excited energy state in the energy continuum greater than the barrier energy. Because the fourth embodiment includes a broadband IR absorbing layer 644, the first and second patches 646, 648 have more widely spaced resonant wavelengths like the second embodiment. As with the previous embodiments, the first and second patches 646, 648 are interconnected by first and second interconnects 650, 652, respectively.

Figure 6E:
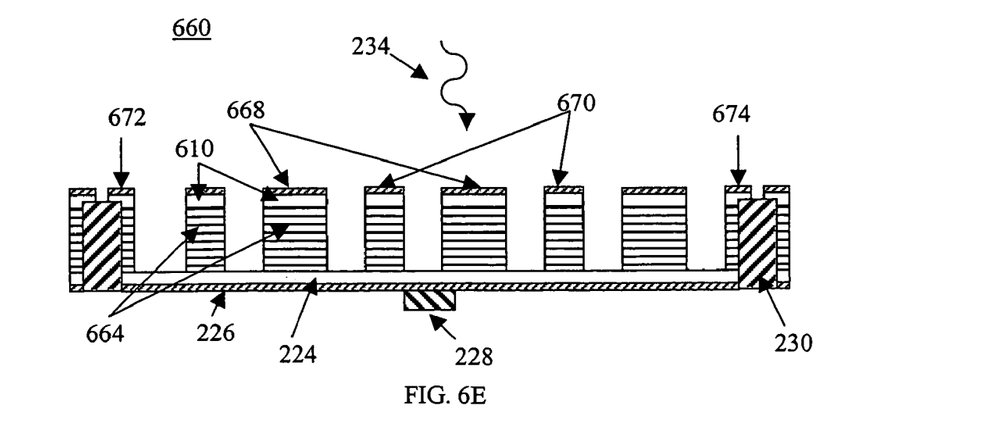

Yet another alternative to the photodetector 600, the fifth embodiment photodetector 660, illustrated in FIG. 6E, employs an interleaved MQW IR absorbing layer 664. Such an interleaved MQW IR absorbing layer 664 will absorb at two distinct wavelengths, much like the photodetector 600 that has first and second IR absorbing layers 612, 616. Much like the third and fourth embodiments, the fifth embodiment does not employ intermediate contacts 614. The overall underlying structure of the fifth embodiment includes the single interleaved MQW IR absorbing layer 664, a top contact 610, and a contact layer 224. The fifth embodiment further includes first and second sets of patches 668, 670 connected by first and second interconnects 672, 674, respectively. As an example interleaved MQW IR absorbing layer 664, a single barrier composition is used with two different well widths. The first well width may be 50 Å and absorb IR radiation in the MWIR while the second well width may be 30 Å and absorb IR radiation in the LWIR. Assuming the first set of patches 668 is designed for operation in the MWIR, the fifth embodiment photodetector 660 generates a first signal between the first interconnect 672 and the contact layer 224 upon absorbing MWIR radiation. With the second set of patches 670 designed for operating in the LWIR, the fifth embodiment photodetector 660 generates a second signal between the second interconnect 674 and the contact layer 224 upon absorbing LWIR radiation. In an effort to improve absorption for devices with only a few absorbing wells for each color, the doping in each well can be increased. As this increased doping will create higher dark currents, and thus noise, at a given operating temperature, such photodetectors may require operation at lower temperatures. An obvious variation on the fifth embodiment is to not interleave the two different well widths, in which case the fifth embodiment may include some bias dependent characteristics.

If photodetector 600 detects two very different wavelengths, for example, the first wavelength is in the MWIR and the second wavelength is in the LWIR, care must be taken in the design of the first and second sets of patches 602, 604. If the first set of patches 602 are designed to resonate at a LWIR wavelength, the first set of patches 602 must not resonate at a harmonic of the desired MWIR wavelength. Similarly, the second set of patches 604 that resonate at a MWIR wavelength must not resonate at a harmonic of the desired LWIR wavelength to ensure adequate spectral purity between the two different wavelength signals.

The method by which an object's temperature may be established using two signals will now be described. All objects at temperatures greater than absolute zero emit IR radiation. This emitted IR radiation follows Planck's law, which gives the magnitude of the radiation as a function of wavelength and temperature of the object. The magnitude shape of a curve generated by Planck's law thus provide one method of determining the temperature of an object. Thus, by using the magnitudes of signals taken at two, or more, different IR wavelengths, and Planck's law, the temperature of the object can be determined. Planck's law is followed perfectly by a blackbody, an object that has an emissivity of 1.0 at all wavelengths, and therefore, the temperature of a blackbody object can be very accurately determined. Most objects have emissivities that are less than one or have emissivities that vary as a function of wavelength, leading to a modified Planck's law. For non-blackbodies, the temperature of the object can still be determined. Objects that have an emissivity of less than one, "gray-bodies," emit IR radiation as a function of wavelength that is identical in shape, but reduced in magnitude in comparison to a blackbody. For these gray-bodies, simple scaling of the magnitude of Planck's law can result in very accurate temperature determination. Temperature determination for an object whose emissivity is a function of wavelength is typically less accurate than for a black or gray-body object, especially if only two different wavelength signals are used. When the emissivity of an object varies as a function of wavelength, the temperature determination is made by assuming the object is a gray-body as emissivity is usually not a strong function of wavelength. When more than two different wavelength signals are used, an averaging process can be used to determine the temperature of the object. For example, if three different wavelength signals are used, the temperature of the object can be determined by combining any two of the three different wavelength signals, resulting in three different combinations. Each of these three combinations will likely result in different determined temperatures. By averaging these three temperatures, or by taking the mean, etc., a more accurate determination of the temperature of the object can be made.

The sixth embodiment is a combination of the polarization-sensitive and color-sensitive embodiments. A photodetector 700 of the sixth embodiment, illustrated in FIG. 7, includes first and second sets of rectangular patches 702 and 704, in conjunction with first and second interconnects 706 and 708. The use of the rectangular patches permits the sixth embodiment to be polarization sensitive. The use of an underlying structure like that shown in FIG. 6B permits the sixth embodiment to be wavelength sensitive. The sixth embodiment generates four signals corresponding to both polarizations at both wavelengths. The dimensions of the first and second set of rectangular patches 702, 704 will need to be selected carefully to avoid resonating at various harmonics of the first and second wavelengths. Further, selection of the wavelengths must be based upon the spectral width of the IR absorbing layers. The sixth embodiment operates as follows: The portion of the first wavelength having a horizontal polarization and the portion of the second wavelength having a vertical polarization resonate in the cavities formed under the first patches 702. Similarly, the portion of the first wavelength having a vertical polarization and the portion of the second wavelength having a horizontal polarization resonate in the cavities formed under the second patches 704.

Figure 7:
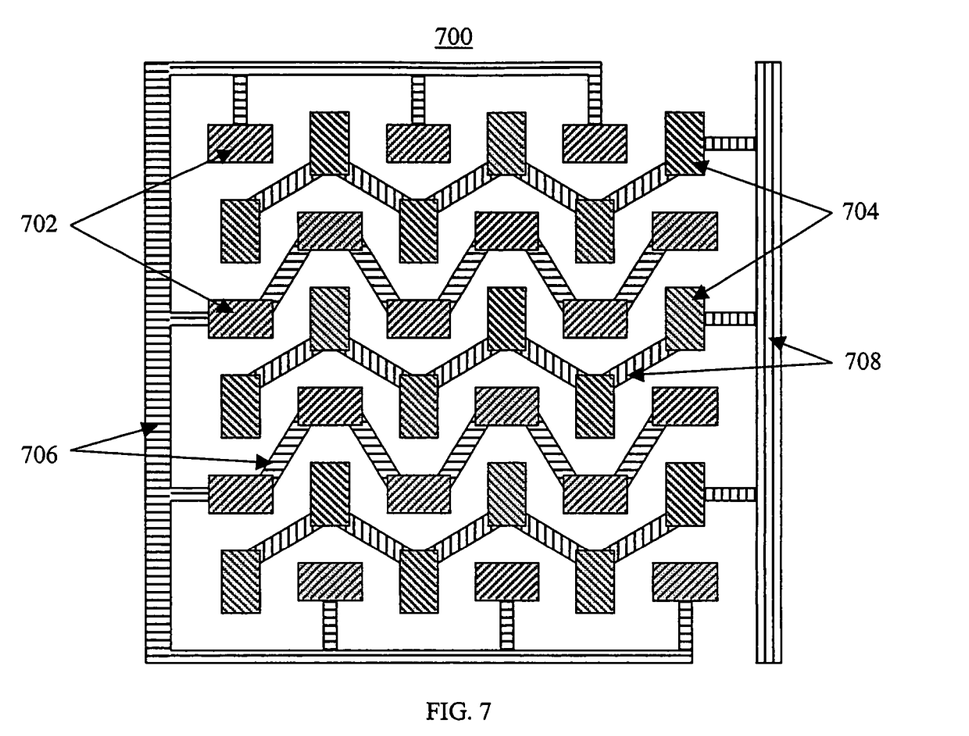
FIG. 7 illustrates a sixth embodiment of the present invention.
Figure 8:
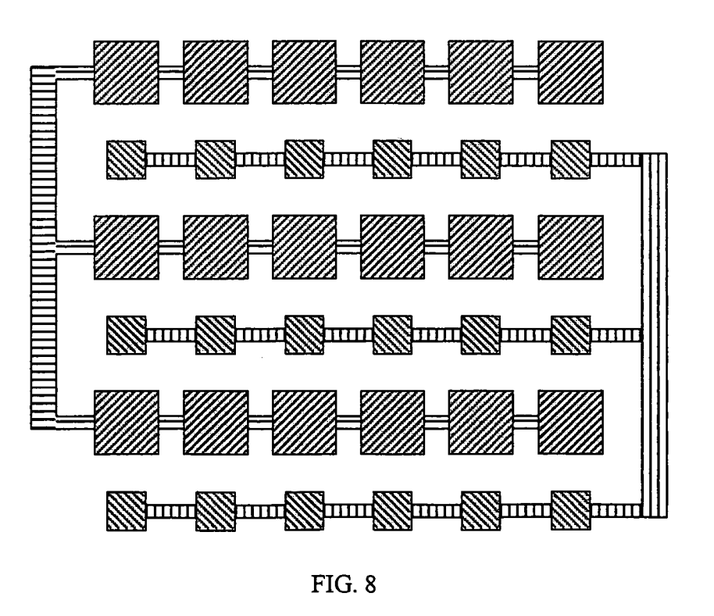
FIG. 8 illustrates a seventh embodiment of the present invention.

While the first through sixth embodiments as illustrated in FIGS. 5, 6, and 7 employ placement of the two patch designs in a checkerboard pattern, this need not be the case. One alternative pattern is to employ one row of patches having a first design while the next row of patches has a second design, thereby interleaving the two sets of patches. A seventh embodiment for determining temperature employing this interleaved design is illustrated in FIG. 8.

While the figures of the various embodiments have illustrated only single detectors, this is not required. A detector array comprising a plurality of individual detectors is also envisioned. Such a detector array can be used to image a scene and, depending upon the embodiment, determine the polarization or the emitted wavelengths and/or temperatures of objects within the imaged scene. Such a detector array may be a one- or two-dimensional array of individual detectors.

Although the present invention has been fully described by way of examples with reference to the accompanying drawings, it is to be noted that various changes and modifications will be apparent to those skilled in the art. Therefore, such changes and modifications should be construed as being within the scope of the invention.

What is claimed is:

1. A detector for detecting a polarization of infrared radiation, the detector comprising:

one or more first contacts, the first contacts being electrically interconnected by a first interconnect;

one or more second contacts, the second contacts being electrically interconnected by a second interconnect;

an infrared absorbing layer for absorbing the infrared radiation, the infrared absorbing layer having first and second opposing surfaces, the first contacts and the second contacts being in electrical contact with the first surface of the infrared absorbing layer;

a contact layer for making electrical contact to the second surface of the infrared absorbing layer;

one or more first patches for coupling infrared radiation of a first polarization to the infrared absorbing layer, each of the first patches extending in a first direction and a second, orthogonal direction, a length of the first patches in the first direction being greater than a length of the first patches in the second direction, each of the first patches being disposed on a surface of a respective first contact opposite the infrared absorbing layer;

one or more second patches for coupling infrared radiation of a second polarization to the infrared absorbing layer, each of the second patches extending in the first and second directions, a length of the second patches in the first direction being less than a length of the second patches in the second direction, each of the second patches being disposed on a surface of a respective second contact opposite the infrared absorbing layer; and a groundplane being disposed on a surface of the contact layer opposite the infrared absorbing layer, wherein the detector generates a first signal between the first contacts and the contact layer when infrared radiation of the first polarization is absorbed by the infrared absorbing layer, and wherein the detector generates a second signal between the second contacts and the contact layer when infrared radiation of the second polarization is absorbed by the infrared absorbing layer.

2. A detector in accordance with claim 1, wherein the infrared absorbing layer includes multiple quantum well semiconductor material.

3. A detector in accordance with claim 2, wherein the multiple quantum well semiconductor material is GaAs/AlGaAs multiple quantum well semiconductor material.

4. A detector in accordance with claim 1, wherein the first and second patches are metallic.

5. A detector in accordance with claim 1, wherein:
the length of each of the first patches in the first direction is equal to the length of each of the second patches in the second direction, and
the length of each of the first patches in the second direction is equal to the length of each of the second patches in the first direction.

6. A detector in accordance with claim 1, wherein:
the length of each of the first patches in the first direction is an odd multiple of $\lambda_{Eff}/2$, where $\lambda_{Eff}$ is an effective wavelength of the infrared radiation in the infrared absorbing layer, and
the length of each of the second patches in the second direction is an odd multiple of $\lambda_{Eff}/2$.

7. A detector in accordance with claim 6, wherein the length of each of the first patches in the first direction is $3\lambda_{Eff}/2$ and the length of each of the second patches in the second direction is $3\lambda_{Eff}/2$.

8. A detector in accordance with claim 1, wherein the first patches are interleaved with the second patches.

9. A detector in accordance with claim 1, wherein the first and second patches cover a portion of the first surface of the infrared absorbing layer, the portion being not more than approximately 35% of an area of the first surface of the infrared absorbing layer and not less than approximately 5% of the area of the first surface of the infrared absorbing layer.

10. A detector in accordance with claim 1, wherein a thickness of the first and second patches is not less than approximately three times a skin depth of the infrared radiation in the first and second patches.

11. A detector in accordance with claim 1, wherein the groundplane is metallic.

12. A detector in accordance with claim 1, wherein a combined thickness of the infrared absorbing layer, the first contacts, and the contact layer is not more than approximately $\lambda_{Eff}/2$, where $\lambda_{Eff}$ is an effective wavelength of the infrared radiation in the infrared absorbing layer.

13. A detector in accordance with claim 12, wherein the combined thickness is not more than approximately $\lambda_{Eff}/4$.

14. A detector array for detecting a polarization of infrared radiation, the detector array comprising:
a plurality of detectors, each detector including:
one or more first contacts, the first contacts being electrically interconnected by a first interconnect;
one or more second contacts, the second contacts being electrically interconnected by a second interconnect;
an infrared absorbing layer for absorbing the infrared radiation, the infrared absorbing layer having first and second opposing surfaces, the first contacts and the second contacts being in electrical contact with the first surface of the infrared absorbing layer;
a contact layer for making electrical contact to the second surface of the infrared absorbing layer;
one or more first patches for coupling infrared radiation of a first polarization to the infrared absorbing layer, each of the first patches extending in a first direction and a second, orthogonal direction, a length of the first patches in the first direction being greater than a length of the first patches in the second direction, each of the first patches being disposed on a surface of a respective first contact opposite the infrared absorbing layer;
one or more second patches for coupling infrared radiation of a second polarization to the infrared absorbing layer, each of the second patches extending in the first and second directions, a length of the second patches in the first direction being less than a length of the second patches in the second direction, each of the second patches being disposed on a surface of a respective second contact opposite the infrared absorbing layer; and
a groundplane being disposed on a surface of the contact layer opposite the infrared absorbing layer,
wherein each detector generates a first signal between the first contacts and the contact layer when infrared radiation of the first polarization is absorbed by the infrared absorbing layer, and
wherein each detector generates a second signal between the second contacts and the contact layer when infrared radiation of the second polarization is absorbed by the infrared absorbing layer.

15. A detector array in accordance with claim 14, wherein the infrared absorbing layer includes multiple quantum well semiconductor material.

16. A detector array in accordance with claim 14, wherein:
the length of each of the first patches in the first direction is an odd multiple of $\lambda_{Eff}/2$, where $\lambda_{Eff}$ is an effective wavelength of the infrared radiation in the infrared absorbing layer, and
the length of each of the second patches in the second direction is an odd multiple of $\lambda_{Eff}/2$.

17. A detector array in accordance with claim 14, wherein the first and second patches cover a portion of the first surface of the infrared absorbing layer, the portion being not more than approximately 35% of an area of the first surface of the infrared absorbing layer and not less than approximately 5% of the area of the first surface of the infrared absorbing layer.

18. A detector array in accordance with claim 14, wherein a thickness of the first and second patches is not less than approximately three times a skin depth of the infrared radiation in the first and second patches.

19. A detector array in accordance with claim 14, wherein a combined thickness of the infrared absorbing layer, the first contacts, and the contact layer is not more than approximately $\lambda_{Eff}/2$, where $\lambda_{Eff}$ is an effective wavelength of the infrared radiation in the infrared absorbing layer.

20. A detector array in accordance with claim 14, wherein the detector array is a one-dimensional array of detectors.

21. A detector array in accordance with claim 14, wherein the detector array is a two-dimensional array of detectors.

22. A method for detecting a polarization of infrared radiation, the method comprising the steps of:
coupling a first polarization of the infrared radiation to an infrared absorbing layer for absorbing infrared radiation, the coupling of the first polarization using one or more first patches, each first patch being disposed on a respective one of one or more first contacts, the first contacts being disposed on a first surface of the infrared absorbing layer, a length of the first patches being greater in a first direction than a length of the first patches in a second, orthogonal direction; and
coupling a second polarization of the infrared radiation to the infrared absorbing layer, the coupling of the second polarization using one or more second patches, each second patch being disposed on a respective one of one or more second contacts, the second contacts being disposed on the first surface of the infrared absorbing layer, a length of the second patches being less in the first direction than a length of the second patches in the second, orthogonal direction;

wherein a first signal is generated between the first contacts and a contact layer, the contact layer being disposed on a second surface of the infrared absorbing layer, the second surface opposite the first surface, the first signal being generated when infrared radiation of the first polarization is absorbed by the infrared absorbing layer, and wherein a second signal is generated between the second patches and the contact layer, the second signal being generated when infrared radiation of the second polarization is absorbed by the infrared absorbing layer.

23. A method in accordance with claim 22, wherein the infrared absorbing layer includes multiple quantum well semiconductor material.

24. A method in accordance with claim 22, wherein:
the length of each of the first patches in the first direction is an odd multiple of $\lambda_{Eff}/2$, where $\lambda_{Eff}$ is an effective wavelength of the infrared radiation in the infrared absorbing layer, and
the length of each of the second patches in the second direction is an odd multiple of $\lambda_{Eff}/2$.

25. A method in accordance with claim 22, wherein the first and second patches cover a portion of the first surface of the infrared absorbing layer, the portion being not more than approximately 35% of an area of the first surface of the infrared absorbing layer and not less than approximately 5% of the area of the first surface of the infrared absorbing layer.

26. A method in accordance with claim 22, wherein a thickness of the first and second patches is not less than approximately three times a skin depth of the infrared radiation in the first and second patches.

27. A method in accordance with claim 22, wherein a thickness of the infrared absorbing layer is not more than approximately $\lambda_{Eff}/4$, where $\lambda_{Eff}$ is an effective wavelength of the infrared radiation in the infrared absorbing layer.

28. A method for determining a man-made object from a natural object by using infrared radiation, the method comprising the steps of:
coupling a first polarization of the infrared radiation to an infrared absorbing layer for absorbing infrared radiation, the coupling of the first polarization using one or more first patches, each first patch being disposed on a respective one of one or more first contacts, the first contacts being disposed on a first surface of the infrared absorbing layer, a length of the first patches being greater in a first direction than a length of the first patches in a second, orthogonal direction; and
coupling a second polarization of the infrared radiation to the infrared absorbing layer, the coupling of the second polarization using one or more second patches, each second patch being disposed on a respective one of one or more second contacts, the second contacts being disposed on the first surface of the infrared absorbing layer, a length of the second patches being less in the first direction than a length of the second patches in the second, orthogonal direction;

wherein a first signal is generated between the first contacts and a contact layer, the contact layer being disposed on a second surface of the infrared absorbing layer, the second surface opposite the first surface, the first signal being generated when infrared radiation of the first polarization is absorbed by the infrared absorbing layer, wherein a second signal is generated between the second patches and the contact layer, the second signal being generated when infrared radiation of the second polarization is absorbed by the infrared absorbing layer; and determining an object is man-made when a magnitude of a difference between the first and second signals is greater than a predetermined threshold and determining an object is natural when the difference between the first and second signals is not greater than the predetermined threshold.

29. A method in accordance with claim 28, wherein the infrared absorbing layer includes multiple quantum well semiconductor material.

30. A method in accordance with claim 28, wherein:
the length of each of the first patches in the first direction is an odd multiple of $\lambda_{Eff}/2$, where $\lambda_{Eff}$ is an effective wavelength of the infrared radiation in the infrared absorbing layer, and
the length of each of the second patches in the second direction is an odd multiple of $\lambda_{Eff}/2$.

31. A method in accordance with claim 28, wherein the first and second patches cover a portion of the first surface of the infrared absorbing layer, the portion being not more than approximately 35% of an area of the first surface of the infrared absorbing layer and not less than approximately 5% of the area of the first surface of the infrared absorbing layer.

32. A method in accordance with claim 28, wherein a thickness of the first and second patches is not less than approximately three times a skin depth of the infrared radiation in the first and second patches.

33. A method in accordance with claim 28, wherein a combined thickness of the infrared absorbing layer, the first contacts, and the contact layer is not more than approximately $\lambda_{Eff}/4$, where $\lambda_{Eff}$ is an effective wavelength of the infrared radiation in the infrared absorbing layer.

34. A method for detecting a wavelength band of infrared radiation, the method comprising the steps of:
coupling a first wavelength band of the infrared radiation to an infrared absorbing layer for absorbing infrared radiation, the coupling of the first wavelength band using one or more first patches, each first patch being disposed on a respective one of one or more first contacts, the first contacts being disposed on a first surface of the infrared absorbing layer, each of the first patches having a first area; and
coupling a second wavelength band of the infrared radiation to the infrared absorbing layer, the coupling of the second wavelength band using one or more second patches, each second patch being disposed on a respective one of one or more second contacts, the second contacts being disposed on the first surface of the infrared absorbing layer, each of the second patches having a second area, the second area being greater than the first area;

wherein a first signal is generated between the first patches and a contact layer, the contact layer being disposed on a second surface of the infrared absorbing layer, the second surface opposite the first surface, the first signal being generated when infrared radiation of the first wavelength band is absorbed by the infrared absorbing layer, and wherein a second signal is generated between the second patches and the contact layer, the second signal being generated when infrared radiation of the second wavelength band is absorbed by the infrared absorbing layer.

35. A method in accordance with claim 34, wherein the infrared absorbing layer includes multiple quantum well semiconductor material.

36. A method in accordance with claim 34, wherein:
a length of each of the first patches in a first direction and in a second, orthogonal direction is an odd multiple of $\lambda_{Eff1}/2$, where $\lambda_{Eff1}$ is an effective wavelength of the first wavelength band of infrared radiation in the infrared absorbing layer, and
a length of each of the second patches in the first and second directions is an odd multiple of $\lambda_{Eff2}/2$, where $\lambda_{Eff2}$ is an effective wavelength of the second wavelength band of infrared radiation in the infrared absorbing layer.

37. A method in accordance with claim 34, wherein the first and second patches cover a portion of the first surface of the infrared absorbing layer, the portion being not more than approximately 35% of an area of the first surface of the infrared absorbing layer and not less than approximately 5% of the area of the first surface of the infrared absorbing layer.

38. A method in accordance with claim 34, wherein a thickness of the first and second patches is not less than approximately three times a skin depth of the infrared radiation in the first and second patches.

39. A method in accordance with claim 34, wherein a combined thickness of the infrared absorbing layer, the first contacts, and the contact layer is not more than approximately $\lambda_{Eff}/4$, where $\lambda_{Eff}$ is an average of a first effective wavelength of the first wavelength band of infrared radiation in the infrared absorbing layer and a second effective wavelength of the second wavelength band of infrared radiation in the infrared absorbing layer.

40. A method for determining a temperature of an object using infrared radiation, the method comprising the steps of:
coupling a first wavelength band of the infrared radiation to an infrared absorbing layer for absorbing infrared radiation, the coupling of the first wavelength band using one or more first patches, each first patch being disposed on a respective one of one or more first contacts, the first contacts being disposed on a first surface of the infrared absorbing layer, each of the first patches having a first area; and
coupling a second wavelength band of the infrared radiation to the infrared absorbing layer, the coupling of the second wavelength band using one or more second patches, each second patch being disposed on a respective one of one or more second contacts, the second contacts being disposed on the first surface of the infrared absorbing layer, each of the second patches having a second area, the second area being greater than the first area;
wherein a first signal is generated between the first patches and a contact layer, the contact layer being disposed on a second surface of the infrared absorbing layer, the second surface opposite the first surface, the first signal being generated when infrared radiation of the first wavelength band is absorbed by the infrared absorbing layer, and
wherein a second signal is generated between the second patches and the contact layer, the second signal being generated when infrared radiation of the second wavelength band is absorbed by the infrared absorbing layer; and
determining the temperature of the object by comparing the first and second signals to Planck's law as a function of temperature at the first and second wavelength bands.

41. A method in accordance with claim 40, wherein the infrared absorbing layer includes multiple quantum well semiconductor material.

42. A method in accordance with claim 40, wherein:
a length of each of the first patches in a first direction and in a second, orthogonal direction is an odd multiple of $\lambda_{Eff1}/2$, where $\lambda_{Eff1}$ is an effective wavelength of the first wavelength band of infrared radiation in the infrared absorbing layer, and
a length of each of the second patches in the first and second directions is an odd multiple of $\lambda_{Eff2}/2$, where $\lambda_{Eff2}$ is an effective wavelength of the second wavelength band of infrared radiation in the infrared absorbing layer.

43. A method in accordance with claim 40, wherein the first and second patches cover a portion of the first surface of the infrared absorbing layer, the portion being not more than approximately 35% of an area of the first surface of the infrared absorbing layer and not less than approximately 5% of the area of the first surface of the infrared absorbing layer.

44. A method in accordance with claim 40, wherein a thickness of the first and second patches is not less than approximately three times a skin depth of the infrared radiation in the first and second patches.

45. A method in accordance with claim 40, wherein a thickness of the infrared absorbing layer is not more than approximately $\lambda_{Eff}/4$, where $\lambda_{Eff}$ is an average of a first effective wavelength of the first wavelength band of infrared radiation in the infrared absorbing layer and a second effective wavelength of the second wavelength band of infrared radiation in the infrared absorbing layer.

46. A detector for detecting a polarization of infrared radiation, the detector comprising:
one or more first contacts, the first contacts being electrically interconnected by a first interconnect;
a first infrared absorbing layer for absorbing a first wavelength band of infrared radiation, the first infrared absorbing layer having first and second opposing surfaces, the first contacts being in electrical contact with the first surface of the first infrared absorbing layer;
one or more intermediate contacts, the intermediate contacts being electrically interconnected by a second interconnect, the intermediate contacts being in electrical contact with the second surface of the first infrared absorbing layer;
a second infrared absorbing layer for absorbing a second wavelength band of infrared radiation, the second infrared absorbing layer having first and second opposing surfaces, the intermediate contacts being in electrical contact with the first surface of the second infrared absorbing layer, the second infrared absorbing layer being disposed on a side of the intermediate contacts opposite the first infrared absorbing layer;
a contact layer for making electrical contact to the second surface of the second infrared absorbing layer;
one or more first patches for coupling infrared radiation of a first polarization and the first wavelength band to the first infrared absorbing layer, each of the first patches being disposed on a surface of a respective first contact opposite the first infrared absorbing layer, each of the first patches having a first area, each of the first patches extending in a first direction and a second, orthogonal direction, a length of the first patches in the first direction being greater than a length of the first patches in the second direction;

one or more second patches for coupling infrared radiation of a second polarization and the second wavelength band to the second infrared absorbing layer, each of the second patches being disposed through one or more layers on a surface of a respective intermediate contact opposite the second infrared absorbing layer, each of the second patches extending in the first and second directions, a length of the second patches in the first direction being less than a length of the second patches in the second direction; and a groundplane being disposed on a surface of the contact layer opposite the second infrared absorbing layer, wherein the detector generates a first signal between the first contacts and the intermediate contacts when infrared radiation of the first polarization and first wavelength band is absorbed by the first infrared absorbing layer, and wherein the detector generates a second signal between the intermediate contacts and the contact layer when infrared radiation of the second polarization and second wavelength band is absorbed by the second infrared absorbing layer.

47. A detector in accordance with claim 46, wherein the first and second infrared absorbing layers include multiple quantum well semiconductor material.

48. A detector in accordance with claim 47, wherein the multiple quantum well semiconductor material is GaAs/AlGaAs multiple quantum well semiconductor material.

49. A detector in accordance with claim 46, wherein the first and second patches are metallic.

50. A detector in accordance with claim 46, wherein:

the length of each of the first patches in the first direction is an odd multiple of $\lambda_{Eff1}/2$, where $\lambda_{Eff1}$ is an effective wavelength of the first wavelength band of infrared radiation in the first infrared absorbing layer, and the length of each of the second patches in the second direction is an odd multiple of $\lambda_{Eff2}/2$, where $\lambda_{Eff2}$ is an effective wavelength of the second wavelength band of infrared radiation in the second infrared absorbing layer.

51. A detector in accordance with claim 46, wherein the first patches are interleaved with the second patches.

52. A detector in accordance with claim 46, wherein the first and second patches cover a portion of the first surface of the first infrared absorbing layer, the portion being not more than approximately 35% of an area of the first surface of the first infrared absorbing layer and not less than approximately 5% of the area of the first surface of the first infrared absorbing layer.

53. A detector in accordance with claim 46, wherein a thickness of the first and second patches is not less than approximately three times a skin depth of the infrared radiation in the first and second patches.

54. A detector in accordance with claim 46, wherein the groundplane is metallic.

55. A detector in accordance with claim 46, wherein a combined thickness of the first and second infrared absorbing layers, the first and intermediate contacts, and the contact layer is not more than approximately $\lambda_{Eff}/2$, where $\lambda_{Eff}$ is an average of a first effective wavelength of the first wavelength band of infrared radiation in the first infrared absorbing layer and a second effective wavelength of the second wavelength band of infrared radiation in the second infrared absorbing layer.

* * * * *